(12) United States Patent
Ebsen et al.

(10) Patent No.: US 9,135,993 B2
(45) Date of Patent: Sep. 15, 2015

(54) TEMPERATURE BASED LOGIC PROFILE FOR VARIABLE RESISTANCE MEMORY CELLS

(71) Applicant: Seagate Technology LLC, Cupertino, CA (US)

(72) Inventors: David Scott Ebsen, Minnetonka, MN (US); Antoine Khoueir, Apple Valley, MN (US); Jon D. Trantham, Chanhassen, MN (US)

(*) Notice: Subject to any disclaimer, the term of this patent is extended or adjusted under 35 U.S.C. 154(b) by 133 days.

(21) Appl. No.: 13/761,975

(22) Filed: Feb. 7, 2013

(65) Prior Publication Data
US 2014/0219003 A1     Aug. 7, 2014

(51) Int. Cl.
*G11C 13/00* (2006.01)
(52) U.S. Cl.
CPC .................. *G11C 13/0004* (2013.01)
(58) Field of Classification Search
USPC ......................................... 365/148, 163, 211
See application file for complete search history.

(56) References Cited

U.S. PATENT DOCUMENTS

| | | |
|---|---|---|
| 6,643,592 B1 | 11/2003 | Loman et al. |
| 7,174,281 B2 | 2/2007 | Abercrombie |
| 7,379,846 B1 | 5/2008 | Williams et al. |
| 7,424,336 B2 | 9/2008 | Ono et al. |
| 8,332,190 B2 | 12/2012 | Tanomura et al. |
| 2004/0264234 A1* | 12/2004 | Moore et al. ............ 365/148 |
| 2005/0273309 A1 | 12/2005 | Yoneyama et al. |
| 2007/0244676 A1 | 10/2007 | Shang et al. |
| 2009/0295457 A1 | 12/2009 | Mowry et al. |
| 2013/0159796 A1* | 6/2013 | Bedeschi ................. 714/708 |
| 2014/0098593 A1* | 4/2014 | Calderoni et al. ....... 365/148 |

* cited by examiner

*Primary Examiner* — Hoai V Ho
(74) *Attorney, Agent, or Firm* — Hall Estill Attorneys at Law (57) ABSTRACT

A data storage device may generally be constructed and operated with at least one variable resistance memory cell having a first logic state threshold that is replaced with a second logic state threshold by a controller. The first and second logic states respectively corresponding to a predicted resistance shift that is based upon an operating temperature profile.

20 Claims, 5 Drawing Sheets

TEMPERATURE BASED LOGIC PROFILE FOR VARIABLE RESISTANCE MEMORY CELLS

SUMMARY

Various embodiments may generally be directed to the management of data storage device having variable resistance memory cells.

In accordance with some embodiments, at least one variable resistance memory cell has a first logic state threshold that is replaced with a second logic state threshold by a controller. The first and second logic states respectively corresponding to a predicted resistance shift that is based upon an operating temperature profile.

DETAILED DESCRIPTION

Advancement in the computing power of electronic devices has emphasized the size, capacity, and speed of data storage device. The proliferation of remote data storage environments like storage clouds has further emphasized the integrity and operating conditions of data memory. For instance, a remote server farm providing cloud data storage for large numbers of users can operate at elevated temperatures and vibrations due to the concurrent electrical and mechanical operation of rotating data storage devices. Even with the advent of solid-state memory to complement or replace rotating data storage, heat produced from large amounts of electrical current flowing through tens of hundreds of thousands of data storage devices can degrade solid-state memory performance.

While air circulation and air conditioning can be used to combat elevated temperature operation for data storage devices, such activities can be costly and may inadvertently result in temperature gradients producing condensation and vast heat margins that can also degrade memory performance. With resistance based solid-state memory being developed, a wide range of heat tolerances can reliably provide data storage and may follow predictable resistance variations in relation to the operating temperatures over time. However, manufacturing specifications are often quite conservative and prevent taking advantage of resistance based solid-state memory potential. Thus, there is a continued industry demand for memory management systems capable of harnessing resistance based solid-state memory potential.

Accordingly, various embodiments have at least one variable resistance memory cell with a first logic state threshold that is replaced with a second logic state threshold by a controller as the first and second logic states respectively correspond to a predicted resistance shift that is based upon an operating temperature profile. The ability to predict the resistance shift in a memory cell and adapt logic states accordingly allows for elevated temperature operation over time, such as temperatures above factory recommended specifications. Through testing and detailed modeling, the operational capacity of a memory cell can be maximized to provide optimized performance, especially in densely packed data storage centers where data storage devices operate with throttled performance to reduce heat production.

Figure 1:
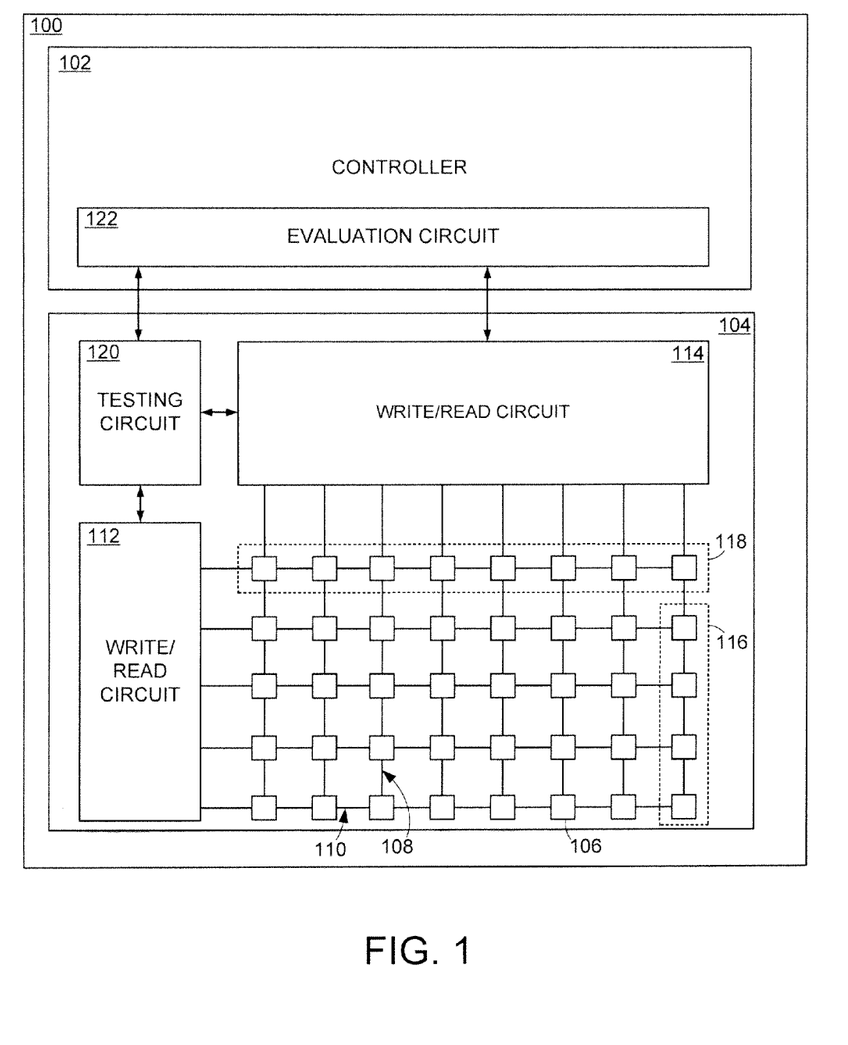
FIG. 1 provides a block representation of a data storage device constructed and operated in accordance with various embodiments.

A variable resistance solid-state memory cell may be utilized and optimized in a variety of non-limiting data storage environments. FIG. 1 provides a block representation of an example data storage device 100 in which various embodiments can be practiced. The device 100, which in some embodiments is configured as a solid-state drive (SSD), has a top level controller 102 and a non-volatile data storage array 104 that may be connected via an unlimited variety of electrical interconnections like wiring, interfaces, busses, and multiplexers. The controller 102 can be used to facilitate the transfer of user data between the storage array 104 and a host device that is internal or external to the storage device 100.

In some embodiments, the controller 102 is a programmable microcontroller that can buffer data in at least one interface circuit pending a transfer between the array 104 and the host device. The position of the controller 102 and storage array 104 are not limited to the concurrent presence illustrated in FIG. 1 as any part of the storage device 100 element may be physically or logically absent while concurrently controlling various operational aspects of the storage device 100. That is, the physical presence of the controller 102 and storage array 104 are not required as either element can be positioned external to the storage device 100, such as across a network accessed with appropriate protocol, while facilitating scheduled and non-scheduled operations within the storage array 104. Similarly, additional controllers and storage arrays may be present internally or externally to the storage device 100 to be selectively utilized, as scheduled and desired.

The data storage array 104 may be configured with any number of separate memory tiers that have common, or individual, control circuitry. The storage array 104 of FIG. 1 illustrates an example portion of memory and control circuitry where a number of non-volatile, non-flash memory cells 106 are arranged in rows and columns that correspond with the overlapping of electrical paths 108 and 110, such as bit and source lines, in an orientation that can be characterized as a cross-point array. One or more write/read circuits 112 and 114 can individually or concurrently control data being written to and read from selected memory cells 106 arranged in sectors 116, pages 118, blocks, and garbage collection units. Such control may be conducted with respect to multiple cells, such as an entire row, page, and block, singularly or successively to expedite data accesses.

A plurality of memory cells 106 are coupled via control lines 110 to an X (row) write/read circuit 112 and via control lines 108 to a Y (column) write/read circuit 114 that allow for write, rewrite, and read operations to be carried out on a predetermined number of the memory cells 106 either individually or collectively. The write/read circuits 112 and 114 can be configured, in some embodiments, to provide reference parameters, such as voltages, resistances, and pulse widths, that may be catered to more than one type of solid-state memory cell. In other words, different sections of memory, such as different pages 118 or blocks of memory, can be configured physically and logically with different types of memory cells that each operate to store data, but correspond with different reference parameters that are provided by the write/read circuits 112 and 114 to accurately translate a read output or write input into a logic state.

In a non-limiting example operation, the write/read circuits 112 and 114 may concurrently provide access to page 118 or unit 116 of memory cells for scheduled or unscheduled user and overhead system operations. One or more testing circuits 120 may provide row and column testing capabilities that are monitored, recorded, and evaluated by the evaluation circuit 122 built-in to the controller 102. The testing circuit(s) 120 can be configured to place one or more memory cells 106 and pages 118 of memory in predetermined states, such as in a common logical and resistance values, that may or may not be online for user access in a testing mode characterized by passage of one or more quiescent currents through the selected memory cells 106 to identify and differentiate one or more different types of cell defects, operating parameters, and types of memory. In other words, a single memory cell 106, or more cells concurrently or successively, may be taken offline and set to a testing mode by the testing circuit(s) 120 to allow a plurality of testing currents to be passed through the cell(s) 106 to determine a variety of biographical, operational, and defective characteristics that are logged and evaluated in the evaluation circuit 122.

As such, the evaluation circuit 122 may direct operation of the testing circuits) 120 as well as write/read 112 and 114 circuits to determine what and how memory cells 106 are operating in the data storage device 100. In some embodiments, the evaluation circuit 122 is constructed as part of the data storage array 104 that may or may not complement additional evaluation circuitry as part of the controller 102. Regardless of where the evaluation circuitry 122 is positioned, evaluation and testing of some or all of the memory cells 106 prior to user data ever being written can be carried out at spontaneous and scheduled times, which can provide baseline operating parameters that may be different from the factory specifications set by the manufacturer.

Various embodiments further can periodically and sporadically conduct tests and evaluations of the operating characteristics of various memory cells 106. Such periodic testing may be conducted during predetermined and emergency times, such as low system processing and idle times, to identify various operational conditions like resistance variances. With the ability to test various memory cells 106 individually and concurrently, the evaluation circuit 122 can adapt to a variety of static and dynamic variations in memory cell performance. However, the reactive correction of operational deviations in tested memory cells can be processing intensive and degrade data accessing speeds. Also, the reactive nature of physical and logical corrections to memory cell 106 variances may not be conducted soon enough to ensure high data reliability. Thus, the evaluation circuit 122 may be configured with a variety of capabilities to allow for the predictive adaptation of memory cells 106 to operational variances identified through proactive modeling.

Figure 2:
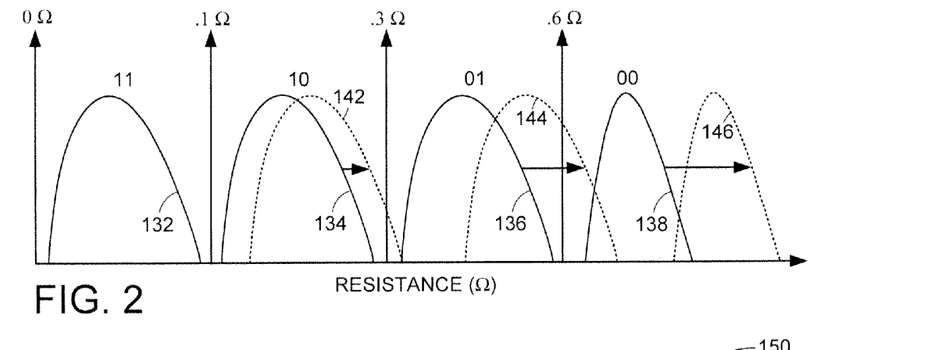
FIG. 2 plots example programmed state distributions for a memory cell capable of being used in the data storage device of FIG. 1.

FIG. 2 plots operational data from an example solid-state memory cell being utilized in a data storage array in accordance with some embodiments. The various resistance regions 132, 134, 136, and 138 respectively correspond to the resistance distributions for a plurality of memory cells programmed to logical values 11, 10, 01, and 00. In some embodiments, one or more solid-state memory cells of a data storage array are configured as a multi-level cell (MLC), which contrasts a single level cell that stores a single bit as either a logical value 0 or 1, by storing n number of bits as 2n logical bit values concurrently, as illustrated in FIG. 2.

While any number of different logical value designations may be utilized without restriction, a logical value convention in accordance with various embodiments assigns a logical value of 11 to the lowest resistance and logical values of 10, 01, and 00 to progressively higher resistances. Regardless of the logical value designations, various memory cell operations can contribute to an inadvertent shift in the resistance of a solid-state memory cell, as displayed by segmented regions 142, 144, and 146. For example but in no way limiting, the number of successive programming cycles of increasing and decreasing the stored resistance of a memory cell, the time a high resistance state has been continually stored in a memory cell, the temperature of a data storage array, and the amount of programming current used to program a memory cell can all contribute to an increase, or decrease, in stable resistance states for a single bit or multi-bit memory cell that increasingly complicate the accurate programming and sensing of data.

A solid-state memory cell can be constructed with materials, layer thicknesses, and overall dimensions conducive to repeatedly providing a plurality of distinct resistances based on a programming current. With the unwanted shift in the stored resistance ranges as illustrated by regions 142, 144, and 146 extending across logical state thresholds, such as $0.3\Omega$ and $0.6\Omega$, logic state accuracy can be tainted as a logical state like 01 can be read as a different state, like 00. Resistance shift may further be exacerbated by attempting to differentiate between stored logical states during a concurrent reading of a page or block of memory cells that contain numerous separate resistances, some of which may have varying degrees of resistance shift.

As the cause for resistance shift is not yet fully understood, prevention of resistance shift has not been reliable. Accordingly, various embodiments are directed to reactive and proactive memory cell optimization that provides the ability to adapt to predicted memory cell variations. Additionally, proactive memory cell optimization can maximize the capabilities of memory cells by altering factory operating parameters, such as resistance thresholds, voltage references, and access pulse widths, to customize the operation of the memory cell to increase the performance of a data storage device.

Figure 3:
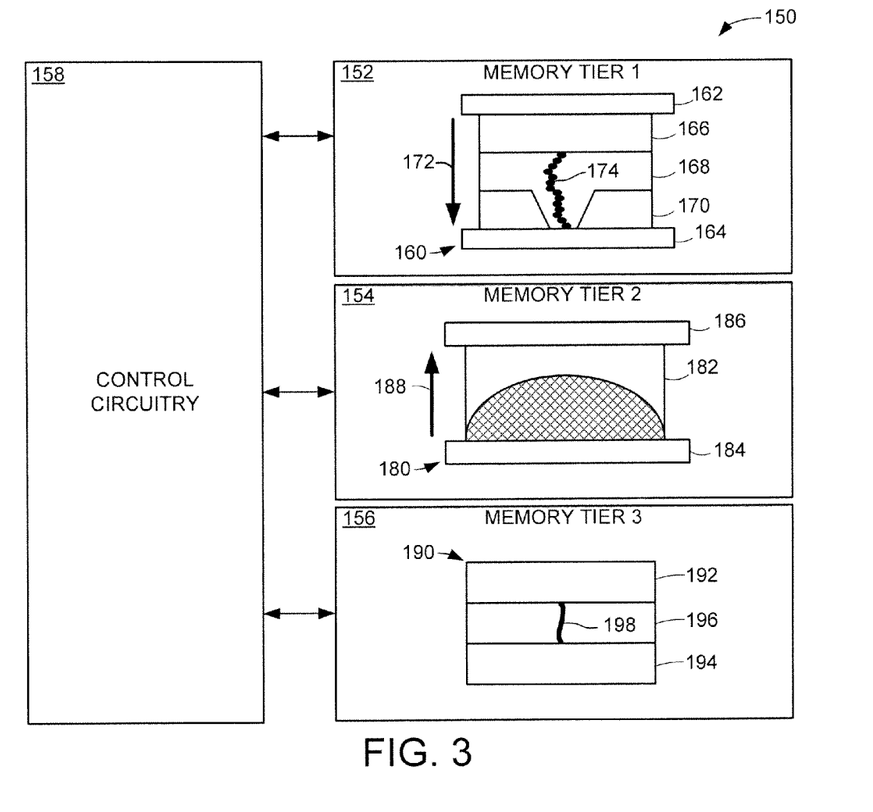
FIG. 3 displays a block representation of an example portion of a data storage device constructed and operated in accordance with some embodiments.

FIG. 3 illustrates a block representation of an example control portion 150 of a data storage device in accordance with various embodiments. The control portion 150 has a plurality of different memory tiers 152, 154, and 156 that are individually and collectively operated through control circuitry 158. In various embodiments, the various memory tiers correspond with different memory cell types. The first memory tier 152 can be constructed and operated with the illustrated programmable metallization cell (PMC) element 160. The PMC element 160 may be formed with top 162 and bottom 164 electrodes, a metal layer 166, an electrolyte layer 168, and a dielectric layer 170. Control circuitry 158 can be used to adjust the relative voltage potential between the first 162 and second 164 electrodes, resulting in passage of a write current 172 through the PMC element 160 to form a filament 174 that changes the resistance of the cell from a high resistance to a low resistance that can correspond to a first predetermined logic state, such as 1.

The filament 174 establishes an electrically conductive path between the metal layer 166 and the bottom electrode 164 by the migration of ions from the metal layer 166 and electrons from the bottom electrode 164. The dielectric layer 170 focuses a small area of electron migration from the bottom electrode 164 in order to control the position of the resulting filament 174. Subsequent application of a write current, in an opposite second direction, through the PMC element 160 causes migration of the ions and electrons back to the respective electrodes 162 and 164 to reset the PMC element 160 to its initial high electrical resistance that corresponds with a different second predetermined logic state, such as 0. PMC elements with a construction similar to that shown at 160 can alternatively be programmed using unipolar programming currents of different magnitudes and/or pulse widths that are selectively provided by the control circuitry 158.

The second memory tier 154 is shown with another non-exclusive type of solid-state memory capable of being used in a data storage array in accordance with various embodiments. The example phase change random access memory (PCRAM) element 180 has a phase change layer 182 disposed between top 184 and bottom 186 electrodes. While not required or limiting, the phase change layer 182 can be formed of a polycrystalline chalcogenide material of group VI of the periodic table, such as Tellurium (Te) and Selenium (Se). while in some embodiments, the phase change layer 182 is formed of $Ge_2Sb_2Te_5$ (GST) or In—Ge—Te.

To place the layer 182 into a relatively high resistance amorphous phase, a fairly high voltage potential is applied across the electrodes 184 and 186 to heat the layer 182 above its melting temperature. The voltage is removed rapidly so as to provide a relatively sharp cooling transition, which may be referred to as a quenching process. In such case, the atoms may not have sufficient time to relax and fully array into a crystalline lattice structure, thereby ending in a metastable amorphous phase and high resistance.

The phase change layer 182 can be programmed to a crystallized phase in response to joule heating caused by the passage of a suitable current 188 of relatively lower magnitude and longer duration through the element 180. The applied pulse is configured to raise the temperature of the layer so as to be above its glass transition temperature and below its melting temperature, and to gradually decrease in temperature back to ambient level. Such temperature gradient will generally provide sufficient dwell time for the material to crystallize. With the programming operation of the PCRAM element 180. data writing currents to place the layer 182 in the respective amorphous and crystalline phases can both be applied in a common direction (uniform polarity) 188, which may provide optimized data programming performance in some data storage arrays.

While the same types of solid-state memory can be used in multiple different memory tiers, the non-limiting embodiment displayed in FIG. 3 has a resistive random access memory (RRAM) element 190 utilized singularly or frequently in the third memory tier 156. The RRAM element 190 has opposing metal or metal alloy electrode layers 192 and 194 that are separated by an intervening oxide layer 196. A first, higher resistance programmed state is established by the nominal electrical resistance of the oxide layer 196. Application of a suitable write voltage potential and/or write current in a selected direction across the element 190 can induce metal migration from the electrode layer 192 and the formation of one or more electrically conductive metallization filaments 198 through the oxide layer 196.

Such filaments 198 generally operate to lower the characteristic resistance of the element 190 and provide different high and low resistance states that can correspond to different logic states. To return the programmed state of the element 190 to a high resistance state, an appropriate write voltage potential and/or current is applied between the electrodes 192 and 194 in a direction that rescinds the filament 198. The creation and subsequent removal of the filament 198 can be less than 10 ns with a 30 μA or less writing current, which may optimize data storage array performance by being implemented alone or in combination with other types of solid-state memory and assigned to operating conditions, such as user data, metadata, and spare cells, that maximize the element's 190 relatively fast programming time and low programming current.

The configuration of multiple different memory tiers can allow for the control circuitry 158 to employ sophisticated data management schemes in which the respective memory tiers 152, 154, and 156 have different memory types, like RRAM, PCRAM, and PCM, but similar memory cell functions, such as metadata and storage of user data, which the control circuitry 158 can selectively utilize to optimize data storage performance. For instance, data initially stored in the first memory tier 152 that is constructed as phase change memory cells can be moved for redundancy or relocation to RRAM memory cells of the second memory tier 154.

The ability to control the type of solid-state memory cell data is to be stored in further allows the various memory tiers to be used in an adaptive fashion to reactive and proactively identified memory cell operational deviations, such as resistance variations. However, it should be noted that the use of different types of memory cells may additionally provide cells with different resistances, reading, and writing profiles that correspond with differing tests and predictive models that are concurrently managed by at least the control circuitry 158 to maximize the adaptability of a memory array to variances in cell resistances.

Figure 4:
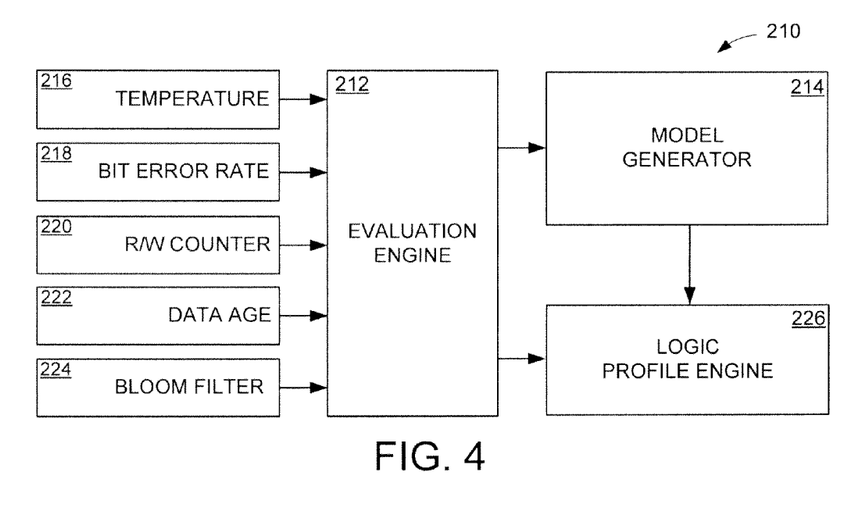
FIG. 4 is a block representation of an example control circuitry portion of a data storage device constructed in accordance with various embodiments.

FIG. 4 provides a block representation of a proactive portion 210 of an example data storage device configured and operated in accordance with various embodiments. An evaluation engine 212 may be separate, like across a wired or wireless network, or integrated within an evaluation circuit like the circuit 122 of FIG. 1. Irrespective of where the evaluation engine 212 is located, a plurality of different types of data may be separately recorded and evaluated by the engine 212 to be passed to a model generator 214 that can process the data and identify probable and imminent memory cell variations, such as resistance, logic state, and access time variations. For example but not limiting, sensors, processing circuits, and timers can provide at least temperature 216, bit error rate 218, read/write counter 220, data age 222, and bloom filter 224 conditions to the evaluation engine 212 for a diverse map of how a data storage array is performing.

One or more temperature sensors 216 can continually and sporadically measure the ambient air temperature of a data storage device as well as the localized temperature of a memory cell, page of memory, and die of memory pages. That is, the air temperature of a device can concurrently or successively lead to the monitoring of individual memory regions to detect particularly hot, or cold, locations. In some embodiments, a threshold temperature, such as 150° F., is set and triggers the investigation of a particular portion of a memory array once the threshold is surpassed. Such investigation may involve taking one or more memory cells offline for testing and predictively changing logic state resistances of cells exposed to temperatures outside a predetermined range. An investigation may result in additional increments may be provided to the read count for one or more memory cells.

A bit error rate (BER) 218 for one or more memory cells may also be monitored by the evaluation engine 212 to predict the physical and logical probability of memory cells that are operating outside of predetermined parameters, like data reliability. For example, a high bit error rate for a memory cell may trigger further investigation or adjustment of cells physically adjacent the identified cell as well as cells logically connected to the identified cell via consecutive data accesses. The bit error rate may be monitored in tiers of memory, such as by blocks and pages, which can result in more efficient analysis as higher BER in higher tiers can subsequently correspond with analysis of fewer cells in lower memory tiers.

Various sectors, pages, blocks, and dies of memory can be continually monitored over an extended time, such as over the life to the data storage device, and for shorter times, such as during the previous hour and week, to provide a read/write counter 220 of the number of data accesses to the evaluation engine 212. Some types of memory and operational conditions, like PCRAM cells being accessed heavily, may be prone to resistance shift, which can be predicted and compensated for in advance. The counter 220 can, in some embodiments, log a multitude of data accesses, like the number of reads, writes, and rewrites, as well as the amount of current being passed through the memory cells to provide data to the evaluation engine 212 and model generator 214 with information on how the various memory cells are being accessed.

While counters may monitor accesses to one or more memory cells, an age counter 222 can operate to record the overall amount of time that has passed since a memory cell was written, read, and changed. Through various environmental and operational memory cell conditions, such as read disturb and undiscovered localized heating and trauma, the relocation of data can proactively improve the accuracy of data storage. The age counter 222 can be complemented by the measured and estimated bit error rate 218 and read/write counter 220 to provide a comprehensive memory cell map that allows the evaluation engine 212 and model generator 214 to create long-range and precise operational models predicting when and which memory cells will deviate from predetermined operational thresholds like resistance states.

A bloom filter 224 can be used to provide a weighted factor approach to track the data from the temperature 216, read/write counter 220, and data age counter 222 and provide the evaluation engine 212 with data that can efficiently be utilized by the model generator 214 to construct memory cell operational predictions. In some embodiments, a weighted factoring may provide an adjusted read count such as:

$$\text{Count(Adj)} = \text{Actual Reads} + K1(\text{Temp}) + K2(\text{Age}) + K3(\text{Delta-}V) \quad (1)$$

where Count(Adj) is an adjusted count value, Actual Reads represents an actual read operation. Temp is a temperature reading/range/zone, Age represents aging of the block, and Delta-V represents detected or predicted changes in cell resistance during a data access operation. Aging can be tracked in a variety of ways with module 222, such as in relation to a total number of writes and/or reads upon the selected memory location. The delta-V value can be utilized responsive to the application of different read voltage and resistance thresholds. It will be appreciated that other factors may be used.

The creation of accurate operation models via the model generator 214 can allow for an unlimited variety of proactive measures to be taken to optimize data storage device performance. One such proactive action may be sending testing data from the evaluation engine 212 and predicted operational data from the model generator 214 to a logic profile engine 226 that compiles a logic profile over time for a variety of operating temperatures. Such logic profile can be based on logged testing, such as initial testing before user data was programmed, and observed operational data, such as resistance variation and bit error rate trends, to provide an accurate prediction of if and when a resistance variation will occur.

Figure 5:
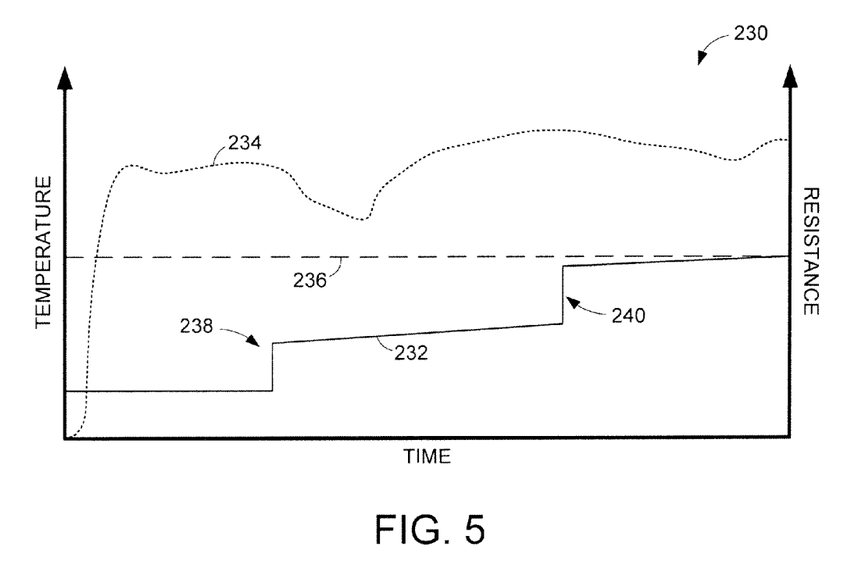
FIG. 5 graphs a variety of operational data corresponding to an example memory cell configured in accordance with some embodiments.

FIG. 5 plots an example logic profile 230 that may be provided by the logic profile engine 226 of FIG. 4 in accordance with some embodiments. As shown by solid line 232, the resistance of memory cell can increase gradually and abruptly depending on the amount of time the memory cell has operated at elevated temperatures. Comparison of the segmented line 234 that corresponds with the memory cell's measured operating temperature over time to the manufacturer's maximum operating temperature 236 reveals that the memory cell can operate at temperatures above the manufacturer's specification 236 with minimal resistance fluctuations besides distinct variations 238 and 240.

It should be noted that the predicted resistance map provided by line 232 is merely illustrative of one possible resistance variation over time and in no way is required or limiting to the variety of predicted resistance variations capable of being compiled. As such, line 232 could just as easily be completely linear or curvilinear with one or more rates of resistance variation, depending on the operating temperature 234 and the time in which the memory cell has experienced the temperature. For clarity, the operating temperature plotted by segmented line 234 can be a single sensed measurement on and around a particular memory cell as well as the combination of ambient air temperature with the temperature of the memory cell itself.

While the measurement manner and predicted data can be illustrated as a logic profile 230 in a variety of different, non-limiting ways, the predicted resistance variation over time allows for efficient monitoring of memory cell temperatures, bit error rates, and time to determine if and when a logic state correction is to take place. That is, the logic profile 230 can provide a variety of different predicted resistance variations for different operating temperatures, such as average and maximum operating temperature, and memory cell types, such as RRAM and PCRAM, which can be evaluated to determine when the logic state of a memory cell is no longer reliable, per the bit error rate, and should undergo a logic correction.

Figure 6:
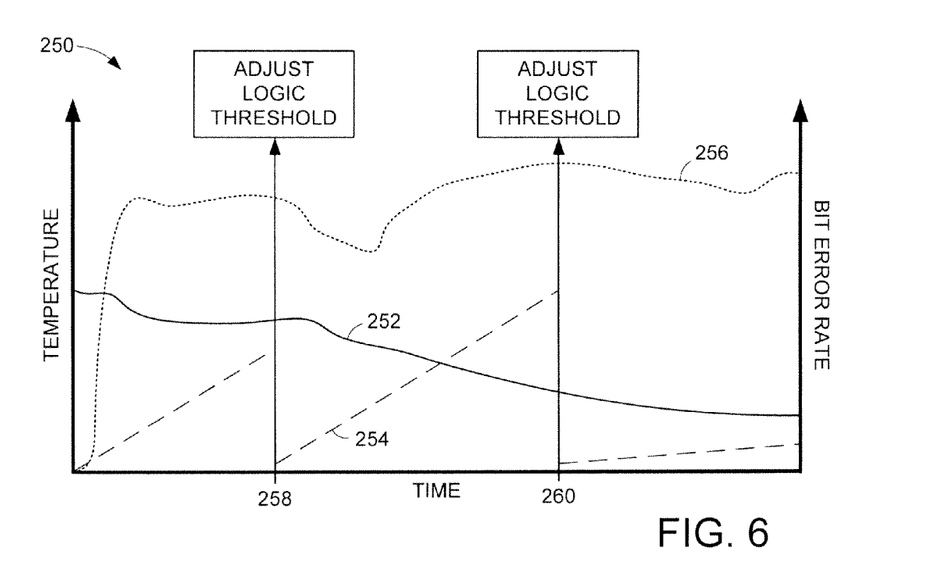
FIG. 6 plots example operation of a memory cell in accordance with various embodiments.

FIG. 6 provides another example logic profile 250 that generally illustrates when logic corrections can be made in accordance with various embodiments. With the resistance 252 of a memory cell being predicted to decrease while bit error rate 254 increases in response to operating temperature 256 over time, a logic correction in the form of adjusting the logic threshold resistance 258 between logical states, such as the 0.3Ω threshold shown in FIG. 2. The prediction of when the logic thresholds are to be adjusted 258 and 260 can allow for the efficient utilization of processing power during times of reduced demand, such as system idle times, so that subsequent testing and data overhead can be manipulated to conform to the new logic thresholds.

In some embodiments, the logic profile 250 is dependent upon unknown and unforeseeable operating temperatures. In such as case, the logic profile engine may proactively perform logic threshold adjustments 258 and 260 based on predicted bit error rate 254. Similarly, a multitude of logic profiles 250 corresponding to different predicted operating temperatures can be averaged to indicate when logic threshold adjustments 258 and 260 are to be performed. With the predictive nature of the logic profile 250, one or more field use tests can be conducted on a cell-by-cell and page-by-page basis to improve the accuracy of the logic threshold adjustment as well as future resistance variation predictions.

Figure 7:
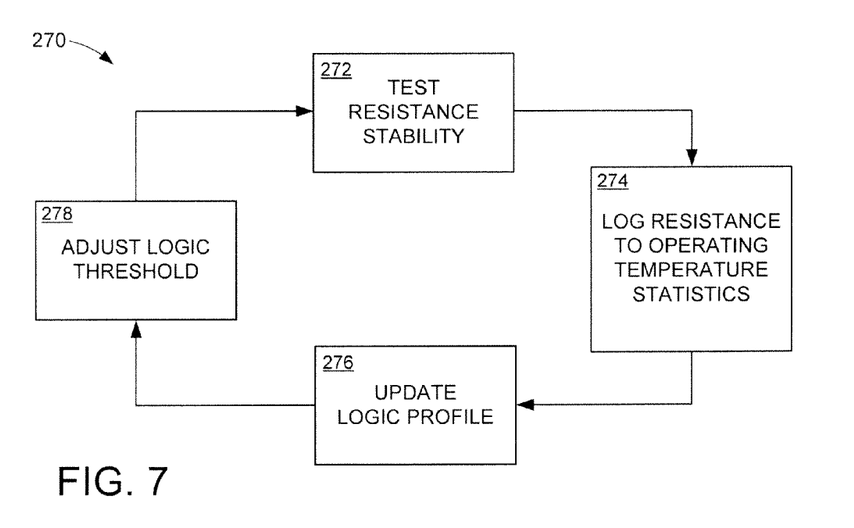
FIG. 7 shows an example logic profile optimization loop carried out in accordance with some embodiments.

FIG. 7 shows an example logical profile optimization loop 270 that may be performed at spontaneous or scheduled times to increase the accuracy of resistance variation predictions. Initially, it is assumed that a logic threshold has been recently performed. Step 272 tests the resistance stability by programming a plurality of logical states to the memory cell and measuring the range of resulting resistances. A log is concurrently or subsequently kept in step 274 to correlate the past and predicted operating temperature to resistance variations with the test results from step 272. The result of the testing and statistical correlation of steps 272 and 274 can identify inaccuracies in the logic profile that can be addressed by updating both the logic profile in step 276 and the prediction model generator.

In the event the prior logic threshold was not stable or could be improved upon, step 278 further adjusts the logic threshold and returns the loop 270 to step 272 where resistance stability is measured. Such testing and evaluation procedures can be conducted at any time and allows for the continual improvement to the predictive generation of logic profiles. The ability to utilize non-flash, individually programmable memory cells, like RRAM and PCRAM cells can further allow for the testing and correction of single memory cells instead of entire pages of cells with flash memory, which may comprise cells with differing resistance and operating temperature capabilities.

Figure 8:
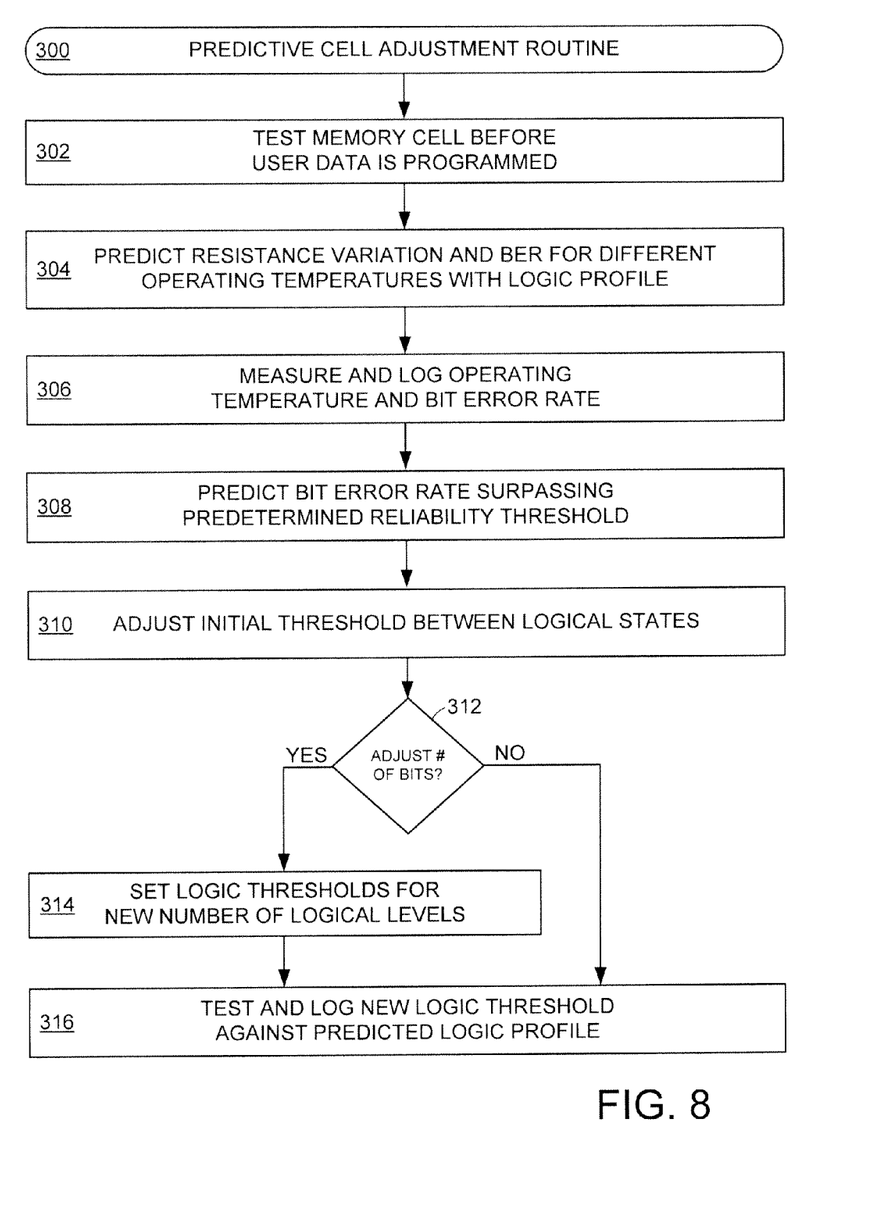
FIG. 8 maps an example cell adjustment routine carried out in accordance with various embodiments.

The logic profile optimization loop 270 is not the only routine that can be conducted to implement a predictive logic profile. FIG. 8 provides a flowchart of an example predictive cell adjustment routine 300 carried out in accordance with various embodiments. It is to be understood that any portion of routine 300 can be conducted at any time, but the entirety of the routine 300 is to be carried out from immediately after the memory cell, and associated data storage device, is manufactured. The routine 300 begins with step 302 testing a memory cell before user data is programmed thereon. Such testing can pass various read and write currents through the memory cell at various temperatures to evaluate the operational capacity and resistance variance propensity of the cell. The testing of 302 may further evaluate the type of solid-state memory, such as RRAM and PCM.

With the memory cell tested, step 304 then predicts the resistance variation and hit error rate (BER) for a variety of different operating temperatures with a logic profile. As discussed above, the logic profile may be compiled based on testing, past performance data, and observed operational trends. Step 304 may further be revisited any number of times to recompile performance and modeling data to predict the resistance variation in the memory cell after elevated temperature operation. Irrespective of the number of times step 304 is conducted, step 306 measures and logs at least the operating temperature and hit error rate for the memory cell.

The predicted resistance variation and bit error rate from step 304 next is compared to the measured operating temperature and bit error rate from 306 to predict when the bit error rate will surpass a predetermined reliability threshold, such as 1:100000. The prediction of when the reliability threshold will happen allows step 310 to schedule a future time in which the resistance threshold between logical states can be undertaken without degrading system processing capacity and data access times. With the proliferation of multi-bit solid state memory cells, as illustrated in FIG. 2, the resistance variance and corrective adjustment of resistance threshold in step 310 may make a multi-bit cell more or less practical, which is evaluated in decision 312 to determine if a modification in the number of bits stored in a particular memory cell should is in order.

If the resistance variation and consequential resistance threshold adjustment in step 310 does correspond with a change in the number of stored bits, step 314 changes the logic thresholds for the new number of logical levels, such as from 4 logical states to 2 or vice versa. At the conclusion of the adjustment in the number of bits stored or if no modification is in order from decision 312, step 316 tests and logs the new logic thresholds against the predicted logic profile. Such post-adjustment evaluation can be conducted with an optimization loop, like loop 270 of FIG. 7, and can continually improve the accuracy of predicted logic profiles.

It should be noted that the various steps and decisions of routine 300 are not required or limited as the various decisions and steps can be omitted, changed, and added, at will. As a non-limiting example, an additional step can be conducted after logic threshold adjustment in step 310 that reorganizes a plurality of memory cells based on predicted and modified logic thresholds. That is, a step could modify the reading and writing data so that cells with higher operating temperature capacities and lower resistance variations, or cells with similar logic threshold values, are logically grouped together.

Through the proactive evaluation and logic threshold adjustment of at least one variable resistance memory cell, elevated temperature memory cell operation can be conducted with the predicted knowledge of how and when resistance variation will occur. The production of a logic profile that correlates predicted bit error rates with operating temperatures and resistance variations can allow a memory cell to undergo resistance variation without exceeding a reliability threshold defined as a maximum bit error rate. Moreover, the proactive and reactive evaluation of memory cells can allow for the optimization of multiple different types of solid-state memory with varying operating temperature capabilities and resistance variation propensities to maximize data access speeds and reliability while taking advantage of the diverse operating parameters of each memory type.

It is to be understood that even though numerous characteristics and configurations of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed. For example, the particular elements may vary depending on the particular application without departing from the spirit and scope of the present technology.

What is claimed is:

1. An apparatus comprising at least one variable resistance memory cell having a logic state corresponding to a first range of resistance values replaced with a second range of resistance values by a controller, the second range of resistance values selected in response to a predicted resistance shift based upon a logic profile.

2. The apparatus of claim 1, wherein the at least one variable resistance memory cell is individually programmable, non-flash memory.

3. The apparatus of claim 1, wherein the at least one variable resistance memory cell is part of a solid-state memory array.

4. The apparatus of claim 3, wherein the solid-state memory array has a plurality of different types of variable resistance memory cells.

5. The apparatus of claim 4, wherein a first type of variable resistance memory cell comprises a programmable metallization cell.

6. The apparatus of claim 5, wherein a second type of variable resistance memory cell comprises a phase change random access memory cell.

7. The apparatus of claim 6, wherein a third type of variable resistance memory cell comprises a resistive random access memory cell.

8. The apparatus of claim 1, wherein the controller comprises an evaluation engine configured to concurrently analyze a plurality of different memory cell operational conditions to reactively identify resistance variance in the at least one variable resistance memory cell.

9. The apparatus of claim 8, wherein the evaluation engine provides a model generator with data to proactively predict resistance variance in the at least one variable resistance memory cell.

10. The apparatus of claim 1, wherein the second range of resistance values corrects for the predicted resistance shift.

11. A method comprising predicting resistance shift with a logic profile for at least one variable resistance memory cell, and replacing a first range of resistance values corresponding to a logic state with a second logic range of resistance values by a controller based upon the predicted resistance shift of the logic profile.

12. The method of claim 11 wherein the logic profile predicts bit error rate and resistance variation for a plurality of different operating temperatures.

13. The method of claim 11, wherein the predicted resistance shift corresponds to predicted resistance variation with measured operational temperature.

14. The method of claim 11, wherein the logic profile indicates when to adjust the at least one variable resistance memory cell to the second range of resistance values to maintain a bit error rate below a predetermined reliability threshold.

15. The method of claim 11, wherein the at least one variable resistance memory cell is transitioned from a multi-bit cell to a single bit cell in response to the predicted resistance shift.

16. The method of claim 11, wherein the at least one variable resistance memory cell is operated at temperatures above manufacturer's specifications.

17. The method of claim 11, wherein a plurality of variable resistance memory cells are concurrently set to the second range of resistance values in response to the predicted resistance shift.

18. The method of claim 11, wherein a single variable resistance memory cell is set to the second range of resistance values in response to the predicted resistance shift.

19. A data storage device comprising:
a controller;
a logic profile engine; and
at least one variable resistance memory cell having a first range of resistance values replaced with a second range of resistance values by the controller in response to the first range of resistance values corresponding to a predicted resistance shift in a logic profile generated by the logic profile engine.

20. The data storage device of claim 19, wherein the logic profile engine predicts when the at least one variable resistance memory cell will exceed a reliability threshold corresponding with a predetermined bit error rate.

* * * * *